(12) United States Patent
Komatsu et al.

(10) Patent No.: US 7,221,177 B2
(45) Date of Patent: May 22, 2007

(54) PROBE APPARATUS WITH OPTICAL LENGTH-MEASURING UNIT AND PROBE TESTING METHOD (75) Inventors: Shigekazu Komatsu, Nirasaki (JP); Takanori Hyakudomi, Nirasaki (JP); Hiromi Chaya, Kyoto (JP); Takahisa Hayashi, Kyoto (JP); Yukihide Shigeno, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/184,796

(22) Filed: Jul. 20, 2005

(65) Prior Publication Data
US 2005/0253613 A1 Nov. 17, 2005

Related U.S. Application Data (63) Continuation of application No. PCT/JP2004/000309, filed on Jan. 16, 2004.

(30) Foreign Application Priority Data
Jan. 20, 2003 (JP) .............................. 2003-011140

(51) Int. Cl.
*G01R 31/02* (2006.01)
(52) U.S. Cl. ...................................... 324/758
(58) Field of Classification Search .................... None
See application file for complete search history.

(56) References Cited

U.S. PATENT DOCUMENTS 4,328,553 A * 5/1982 Fredriksen et al. .... 356/139.04
5,583,445 A * 12/1996 Mullen ........................ 324/753
5,640,101 A * 6/1997 Kuji et al. ................... 324/754
5,642,056 A * 6/1997 Nakajima et al. ............ 324/758
5,661,548 A * 8/1997 Imai ............................. 355/55
6,023,172 A * 2/2000 Krivy ........................... 324/756
6,037,793 A * 3/2000 Miyazawa et al. .......... 324/760
6,140,828 A * 10/2000 Iino et al. .................... 324/758
6,741,328 B2 * 5/2004 Yonekawa et al. ............ 355/53
6,927,587 B2 * 8/2005 Yoshioka ..................... 324/754
7,119,564 B2 * 10/2006 Martens et al. ............. 324/754
2004/0036861 A1   2/2004 Yoshioka

FOREIGN PATENT DOCUMENTS

JP     8-124978     5/1996

(Continued)

*Primary Examiner*—Ha Tran Nguyen
*Assistant Examiner*—Richard Isla-Rodas
(74) *Attorney, Agent, or Firm*—Oblon, Spivak, McClelland, Maier & Neustadt, P.C.

(57) ABSTRACT

A probe apparatus with control-position detection means is provided for testing an electrical characteristic of a to-be-tested object formed on a substrate W. The probe apparatus includes a prober chamber, a susceptor provided in the prober chamber for placing thereon a to-be-tested object, and a moving mechanism for moving the susceptor in X-, Y-, Z- and θ-directions. The probe apparatus further includes a probe card having a plurality of probes and opposing the susceptor, and a first optical length-measuring unit. The first length-measuring unit emits light to the surface of the to-be-tested object placed on the susceptor, and detects the Z-directional position of the to-be-tested object based on the light reflected from the object. The probe apparatus can have a second length-measuring unit.

17 Claims, 7 Drawing Sheets

FOREIGN PATENT DOCUMENTS

| | | | |
|---|---|---|---|
| JP | 11-26524 | 1/1999 | |
| JP | 11-271360 | 10/1999 | |
| JP | 361168237 | * 7/2006 | ................ 324/754 |
| WO | WO 02/075801 A1 | 9/2002 | |
| WO | WO 02/075807 A1 | 9/2002 | |

* cited by examiner

PROBE APPARATUS WITH OPTICAL LENGTH-MEASURING UNIT AND PROBE TESTING METHOD

CROSS-REFERENCE TO RELATED APPLICATIONS

This is a Continuation Application of PCT Application No. PCT/JP2004/000309, filed Jan. 16, 2004, which was published under PCT Article 21(2) in Japanese.

This application is based upon and claims the benefit of priority from prior Japanese Patent Application No. 2003-011140, filed Jan. 20, 2003, the entire contents of which are incorporated herein by reference.

BACKGROUND OF THE INVENTION

1. Field of the Invention

The present invention relates to a probe apparatus and probe testing method for testing the electrical characteristic of a plurality of to-be-tested objects (hereinafter referred to as "chips") provided on a substrate (hereinafter referred to as a "wafer") W. More particularly, it relates to a probe apparatus that includes detection means for directly detecting the position of each chip and the position of a probe card, and a probe testing method.

2. Description of the Related Art

To detect the position of a chip, it is necessary to align the X-, Y-, Z- and θ-directional positions of the probes of a probe card with those of the chip, and to raise the chip toward the probes to bring it into accurate contact with the probes with a predetermined overdrive amount. To this end, it is necessary to accurately detect the position of the chip. Since the foundation layers of the electrode sections or electrodes of recent chips are thin and soft, excessive overdrive may damage, expose and/or crack the foundation layers. To achieve such alignment, each electrode of a chip and the tip of each probe have been photographed by a camera to detect their positions. The detection of the X-, Y-, Z- and θ-directional positions using a camera can be performed highly accurately, and is therefore widely utilized. However, in Z-directional positioning using a camera, the camera is focused on a target, and the distance therebetween is measured. Accordingly, this method is disadvantageous, for example, in that the range of distances that can be measured is narrow, and the detection accuracy is low. A detection error, if there is any, adversely influences the contact pressure between the probes and the chip. As a result, the probes and chip may be damaged, or the probes may not satisfactorily contact the chip to cause a characteristic detection error. Jpn. Pat. Appln. KOKAI Publication No. 11-26524 discloses an apparatus for performing Z-directional positioning of probes and a chip using optical length-measuring units. Although the apparatus disclosed in this publication has two optical length-measuring units, it cannot directly detect the positions of the probes and the chip. Further, it is necessary to move a main chuck to a predetermined position for position detection. It is also necessary to perform focusing of a camera during position detection, and to measure the distance between the probes and the chip from the focal point. Therefore, much time is required for position detection, and accurate position detection cannot be achieved.

BRIEF SUMMARY OF THE INVENTION

In accordance with an aspect, the invention provides a probe apparatus capable of reducing a detection error using a simple structure, and appropriately controlling the overdrive amount to further enhance the reliability of tests, and a probe testing method for enabling such control.

In accordance with another aspect, the invention provides a probe apparatus capable of detecting a change in Z-directional position due to deformation of a probe card, thereby performing more accurate positioning of a chip and probes, and a probe testing method for enabling such accurate positioning.

In accordance with a first aspect of the invention, there is provided a probe apparatus for testing an electrical characteristic of a to-be-tested object formed on a substrate W.

The probe apparatus comprises: a prober chamber; a susceptor provided in the prober chamber and configured to place thereon a substrate with a plurality of to-be-tested objects formed; a probe card provided in the prober chamber (the probe card includes a plurality of probes and opposes the susceptor); and a first optical length-measuring unit (the first optical length-measuring unit emits light to the surface of each to-be-tested object placed on the susceptor, detects the position, on the light-receiving surface of the first optical length-measuring unit, of light reflected from the each to-be-tested object, and detects the Z-directional position of the each to-be-tested object based on the detected position of light reflected).

The probe apparatus of the invention according to the first aspect may include one or several of the following preferable structures (1) to (12):

(1) A reference plane is attached to the susceptor, the reference plane being referred to when the first optical length-measuring unit detects the Z-directional position.

(2) The light emitted from the first optical length-measuring unit is a laser beam.

(3) The laser beam has a diameter of 10 to 30 µm.

(4) The first optical length-measuring unit is attached to one of an upper wall and a sidewall of the prober chamber.

(5) A moving mechanism for moving the susceptor in a Z-direction, and a control unit for controlling the moving mechanism are also provided. The first optical length-measuring unit detects the Z-directional positions of a plurality of surface portions of one of the susceptor and the substrate placed on the susceptor. Further, the control unit creates a map concerning the Z-directional positions of the plurality of surface portions, based on the Z-directional positions of the plurality of surface portions detected by the first optical length-measuring unit.

(6) A second optical length-measuring unit emits light to the surface of a support member supporting the probe card, detects the position, on the light-receiving surface of the second optical length-measuring unit, of light reflected from the support member, and detects the Z-directional position of the probe card based on the detected position of light reflected.

(7) The light emitted from the second optical length-measuring unit is a laser beam.

(8) A holding plate is also provided (the holding plate is located above the probe card), and the second optical length-measuring unit is attached to the surface of the holding plate opposing the probe card.

(9) A probe-card support member supporting the probe card is also provided (the probe-card support member is attached to the upper surface of the probe card), and the second optical length-measuring unit detects the upper surface of the probe-card support member to detect a change in the Z-directional position of the probe card.

(10) The probe-card support member includes a reflector provided on a portion thereof to be detected by the second optical length-measuring unit, the reflector reflecting the emitted light.

(11) The second optical length-measuring unit detects a side surface of the probe card to detect a change in the Z-directional position of the probe card.

(12) The probe card includes an optical element provided on a side surface thereof to be detected by the second optical length-measuring unit, the optical element reflecting the emitted light.

In accordance with a second aspect of the invention, there is provided a method of testing a to-be-tested object using the probe apparatus provided with the structure (1). The method comprises:

(a) placing the substrate on the susceptor; (b) (b1) detecting the Z-directional position of the reference plane attached to the susceptor, using the first optical length-measuring unit; (b2) raising the susceptor and bringing the reference plane into contact with the probes to measure the distance between the reference plane and the probes; (c) detecting the Z-directional position of the to-be-tested object, using the first optical length-measuring unit; (d) measuring the distance between the surface of the to-be-tested object and the tips of the probes based on results of the (b) and (c); (e) raising the susceptor in a Z-direction to bring the to-be-tested object into contact with the probes, using a moving mechanism based on the distance between the to-be-tested object and the probes measured in the (d); (f) measuring the electrical characteristic of the to-be-tested object; and (g) moving the substrate by a measuring pitch corresponding to one to-be-tested object, repeating the (e) to (f) to detect the position of a next to-be-tested object.

It is preferable that the above method includes one of several of the following features (13) and (14):

(13) (c1) The Z-directional positions of a plurality of surface portions of the substrate are detected using the first optical length-measuring unit.

(c2) A map concerning the detected Z-directional positions of the plurality of surface portions of the substrate is created.

(c3) Based on the map created in the (c2), the susceptor is moved in the Z-direction to bring the to-be-tested object into contact with the probes, using the moving mechanism.

(14) (a2) After the (a), a second optical length-measuring unit emits light to the upper surface of a support member supporting the probe card, detects the position, on the light-receiving surface of the second optical length-measuring unit, of light reflected from the support member, and detects the Z-directional position of the probe card based on the detected position of light reflected.

The (d) includes measuring the distance between the to-be-tested object and the probes, based on the detection result acquired in the (a2) in addition to the detection results acquired in the (b) and (c).

The invention can be applied to a probe apparatus and probe testing method for measuring the electrical characteristic of a to-be-tested object (e.g., a semiconductor device) provided on a wafer.

DETAILED DESCRIPTION OF THE INVENTION

Figure 1:
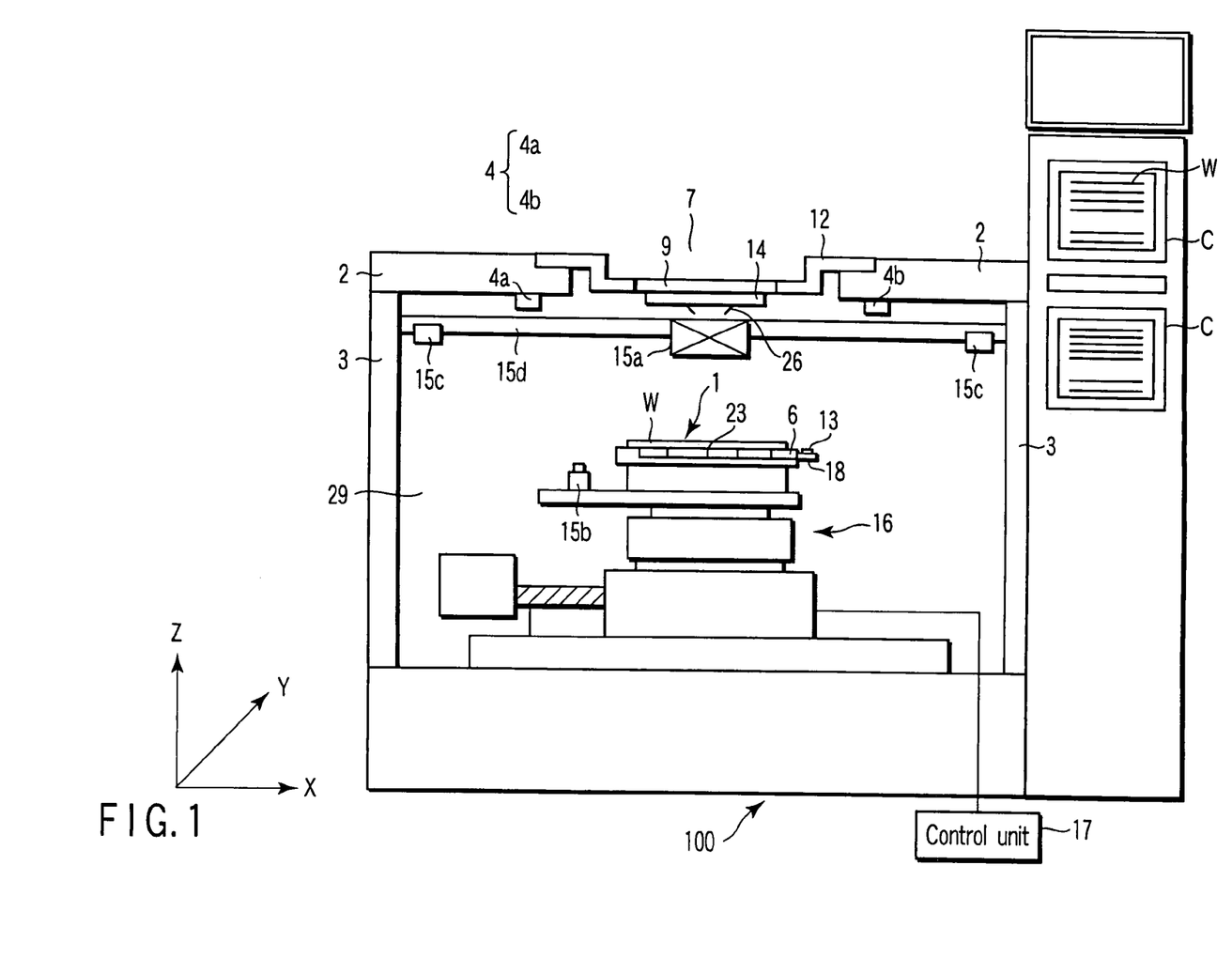
FIG. 1 is a sectional view of a probe apparatus according to a first embodiment.

Referring to several drawings, a first embodiment of the invention will be described. FIG. 1 is a sectional view illustrating the main unit of a probe apparatus 100 according to the first embodiment of the invention. The probe apparatus 100 of the embodiment has a prober chamber 29. The prober chamber 29 has an upper wall 2 and sidewalls 3. The upper wall 2 may have an opening 7 at the center. The prober chamber contains a susceptor 6 for placing thereon a substrate (hereinafter referred to simply as a "wafer") W. The susceptor 6 is mounted on a moving mechanism 16. The moving mechanism 16 moves the susceptor in the X-, Y-, Z- and θ-directions. The moving mechanism 16 is controlled by a control unit 17.

Figure 2:
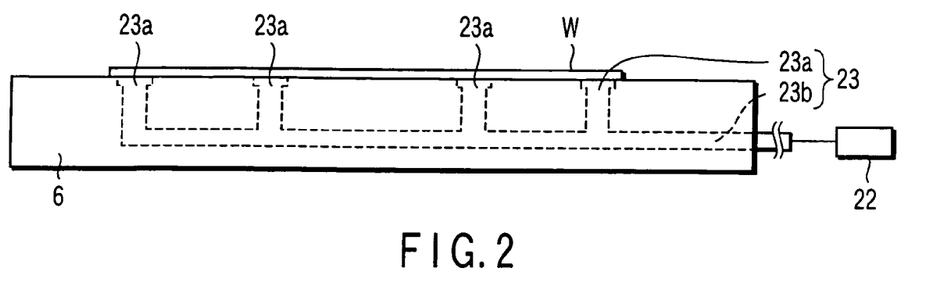
FIG. 2 is a view of an example of a substrate-fixing mechanism 23 employed in each embodiment of the invention.

The susceptor 6 may have a substrate-fixing mechanism 23 for holding a wafer W placed thereon. FIG. 2 shows an example of the substrate-fixing mechanism 23. The substrate-fixing mechanism 23 includes, for example, grooves 23a formed in the surface of the susceptor, and a air charging/discharging hole 23b connected to the grooves 23a. When a vacuum pump 22 removes by suction air from the grooves 23a via the hole 23b, the wafer W is fixed on the surface of the substrate-fixing mechanism 23. The substrate-fixing mechanism 23 can employ, as well as the vacuum suction mechanism, a holding mechanism utilizing static electricity, or a mechanical holding mechanism.

Figure 3:
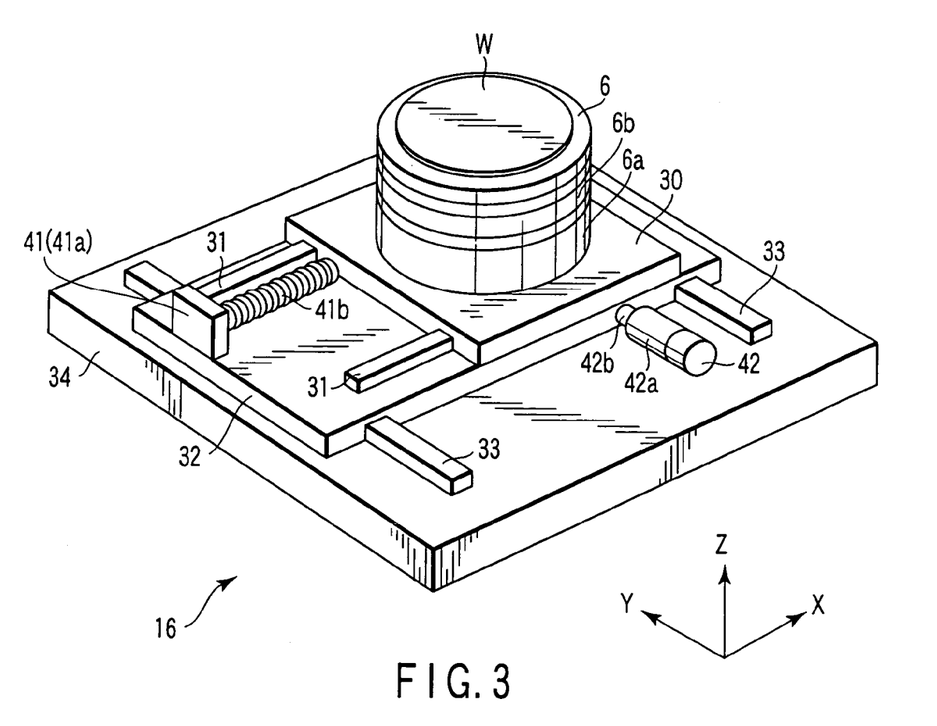
FIG. 3 is a view of an example of a moving mechanism 16 employed in each embodiment of the invention.

FIG. 3 shows an example of the moving mechanism 16 for moving the susceptor 6. The moving mechanism 16 comprises the susceptor 6 with the wafer W placed thereon, an X-stage 30 for supporting the susceptor 6, a Y-stage 32 for supporting the X-stage, and a base table 34 for supporting these. When the electrical characteristics of the wafer W is tested, the susceptor 6 is moved in the X- and Y-directions by the X- and Y-stages 30 and 32, and is vertically moved in the Z-direction by a vertical driving mechanism 6a provided as the lower portion of the susceptor 6. The X-stage 30 is reciprocated on the Y-stage 32 by an X-directional driving mechanism 41 along X-directional rails 31. The Y-stage 32 is reciprocated on the base stable 34 by a Y-directional driving mechanism 42 along Y-directional rails 33. The X- and Y-directional driving mechanisms 41 and 42 have motors 41a and 42a and ball screws 41b and 42b, respectively. The ball screws 41b and 42b are engaged with the X- and Y-stages 30 and 32, respectively, thereby permitting the X- and Y-stages 30 and 32 to move. The vertical driving mechanism 6a may be formed of, for example, a motor, a ball screw rotated in opposite directions by the motor, and a nut member engaged with the ball screw and fixed to the susceptor. By rotating the ball screw by the motor, the susceptor 6 is vertically moved via the nut member. Further, the susceptor 6 includes a θ-directional rotation mechanism 6b. The θ-directional rotation mechanism 6b rotates the susceptor 6.

The moving mechanism that can be employed in the invention is not limited to that shown in FIG. 3, but may be any type of moving mechanism if it can rotate the susceptor in the X-, Y-, Z- and θ-directions.

In FIG. 1, in the opening 7 formed in the upper portion of the prober chamber 29, a probe card 14 is opposed to the susceptor 6. The probe card 14 has a plurality of probes 26 for testing the electrical characteristic of each chip 1 formed on the wafer W. The probe card 14 may be attached to, for example, the lower surface of a probe-card support member 9. The probe-card support member 9 may be directly attached to the upper wall 2, or be detachably attached to a head plate 12 fitted in the opening 7 of the upper wall 2.

Further, the prober chamber 29 contains upper and lower cameras 15a and 15b used to detect the X-, Y- and θ-directional positions of each chip 1 and the probe 26. The lower camera 15b may be placed near the susceptor 6, while the upper camera 15a may be placed at an upper position in the prober chamber 29. The upper camera 15a is attached to, for example, the longitudinally central portion of an alignment bridge 15d located in the X-direction. The alignment bridge 15d can be reciprocated in the Y-direction along guide rails 15c provided on the upper portions of the sidewalls of the prober chamber.

The lower camera 15b photographs the tips of the probes 26 of the probe card 14, and the upper camera 15a photographs the electrodes of each chip 1 formed on the wafer W. Based on the coordinate positions of the photographed members, the control unit 17 calculates the positional relationship between the electrodes of each chip 1 and the tips of the probes 26, thereby moving the susceptor 6 to align each chip 1 with the probe 26.

To align the Z-directional positions of each chip 1 and the probes 26, the first embodiment of the invention employs a first optical length-measuring unit 4 (4a, 4b). The first optical length-measuring unit 4 can emit light to the surface of each chip 1 formed on the wafer W that is placed on the susceptor 6, detect the position, on a light-receiving surface thereof, of light reflected from each chip, and directly and accurately detect the Z-directional position of each chip 1 based on the detected position of light reflected. The first optical length-measuring unit 4 can be provided at any position in the prober chamber 29. However, if, in particular, it is provided on the upper wall 2 or on the upper portion of the sidewall 3, it can perform accurate position detection with little blurring.

Figure 4:
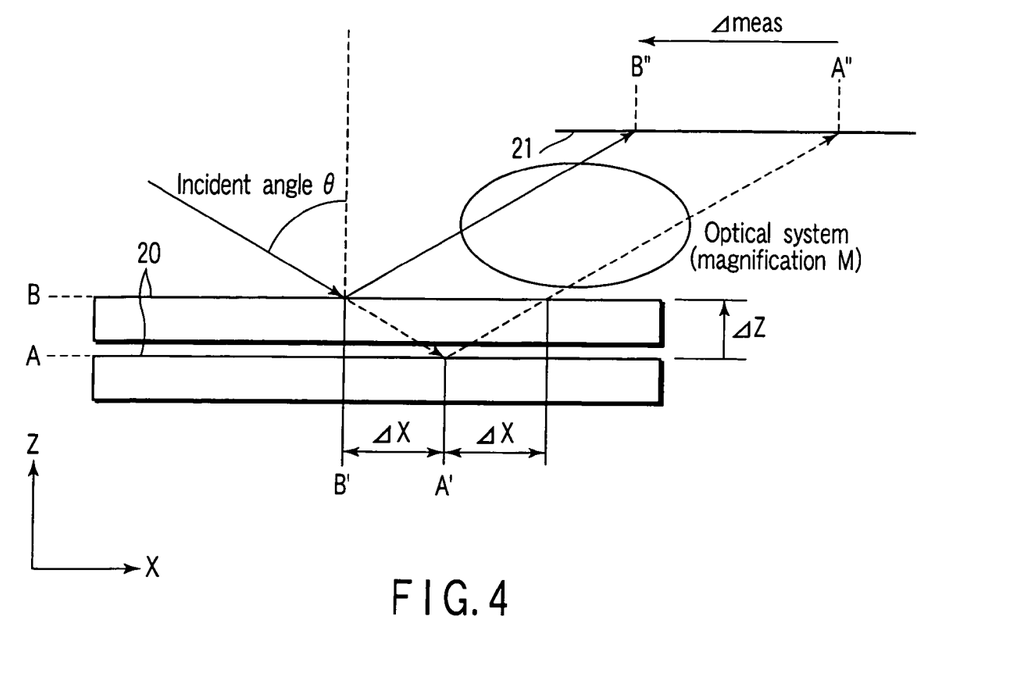
FIG. 4 is a view illustrating the principle of an optical length-measuring unit for use in each embodiment.

The first optical length-measuring unit 4 includes a first irradiator 4a and first detector 4b. Light emitted from the first irradiator 4a reflects from a to-be-measured object, such as the chip 1, and enters the first detector 4b. At this time, if the Z-directional position of the plane that reflects the light is changed, the incident position of the light on the detector is shifted. Based on the shift amount of the light, the Z-directional position of the plane that reflects the light can be detected. FIG. 4 is a view illustrating the principle of measurement. When a reflection plane 20 is positioned at position A, light reflects from point A'. When the reflection plane is positioned at position B, light reflects from point B'. These reflected light beams enter points A" and B" on an incident plane 21. Assume here that a change in the position of a point from which light reflects is ΔX, a change in the Z-directional position of the reflection plane is ΔZ, the magnitude of an optical system, through which light from the reflection plane 20 enters the incident plane, is M, and the angle of incidence of light entering the reflection plane is θ. Further, assume that the distance between points A" and B" on the incident plane is Δmeas, from point A" to point B" the incident position of light on the incident plane being shifted when the reflection plane is changed from A to B. In this case, the following equations are established:

$$\Delta X = \Delta Z \tan \theta \quad (1)$$

$$\Delta meas = 2 \times \Delta X \times M \quad (2)$$

From (1) and (2), $$\Delta meas = 2 \times M \times \tan \theta \times \Delta Z$$

Since 2×M×tan θ is a constant, if it is substituted by K, ΔZ is given by $$\Delta Z = (1/K) \times \Delta meas$$

From this, it is understood that ΔZ can be determined if Δ meas is measured.

The use of the optical length-measuring unit enables even a slight change in the position of a reflection plane to be detected, and hence can realize more accurate position detection than the conventional position detection method utilizing the focus of a camera. Further, in the position detection utilizing the focus of a camera, it is necessary to vertically move the susceptor 6 to focus a camera on the chip 1, with the result that much time is required for position detection. In contrast, in the optical length-measuring unit, if a to-be-measured object, i.e., the chip 1, is positioned in a detection range, the position of the object can be detected without vertically moving the susceptor, thereby significantly reducing the time required for the position detection. Furthermore, the Z-directional detectable range of the optical length-measuring unit is 200 μm, which is wider than that of the method utilizing the focus of a camera. Namely, position detection can be more easily performed. The Z-directional detectable range of the optical length-measuring unit can be further widened if a longer length-measuring sensor is used.

In the first embodiment of the invention, since the surface of the wafer W, i.e., the chip 1, can be directly detected by a single optical length-measuring unit, the probe apparatus can be made to a simple structure, and detection errors in the length-measuring unit can be reduced to thereby enhance the detection accuracy. Further, where a mechanism that performs detection based on a change in the position of incident light on a detector, not based on the amount of reflected light, like the optical length-measuring unit of the embodiment, is employed, reliable detection results can be acquired regardless of the state of the reflection plane. Furthermore, since the first optical length-measuring unit 4 used in the embodiment can detect the position of a target even at a far distance, it may be placed at any position, at which it can detect the position of the chip 1 on the susceptor 6.

Although LED visible light, for example, can be used for the first optical length-measuring unit 4, it is desirable to use a laser beam. When a laser beam is used for the first optical length-measuring unit 4 of the invention, easy and accurate position detection can be achieved. The diameter of the laser beam used in the embodiment can be set to 10 to 30 μm. At present, each electrode of generally used chips 1 has a length of 35 to 100 μm. The use of a laser beam, which has a diameter smaller than the length of each electrode, enables only the position of an electrode to be detected without being influenced by a surface pattern near the electrode. The first optical length-measuring unit 4 also can test the planarity of the susceptor or wafer W by three-dimensionally detecting the surface of the susceptor 6 or wafer W.

The probe apparatus of the first embodiment shown in FIG. 1 may further comprise a reference plane 13 used as means for detecting the position of the tip of each probe. The reference plane 13 can be used as a reference position to be detected by the optical length-measuring unit 4. The reference plane 13 may be provided on the susceptor 6, or on a reference table 18 attached to the susceptor 6. It is sufficient if the reference plane 13 is a flat and reflective surface. This plane may be formed of the surface of a metal sheet or metal-plated sheet. In the first embodiment, the surface of an Au-plated sheet is utilized.

Figure 5:
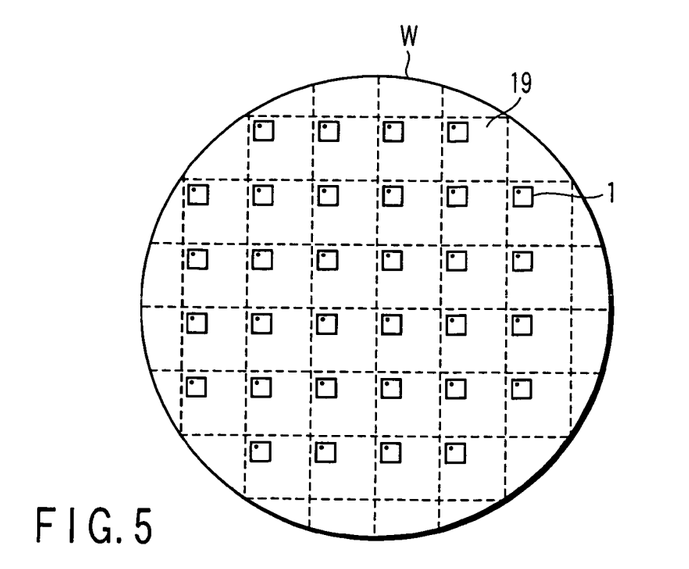
FIG. 5 is a view illustrating an example of a map used in each embodiment, in which a wafer W is divided into zones.

The first optical length-measuring unit 4 (4a, 4b) can detect the position of each electrode of each chip 1 formed on the wafer W. Z-directional position information concerning each electrode of each chip 1 measured is sent to the control unit 17 and used to control the distance to the probes 26 over which the susceptor 6 is raised. The optical length-measuring unit 4 can also be used to detect the Z-directional positions of a plurality of surface portions of the wafer W and form a map. In this case, since position detection can be performed at high speed, the positions of the electrodes of all chips can be detected. Alternatively, as shown in FIG. 5, the surface of the wafer W may be divided into several zones 19, to thereby detect the positions of points that represent the respective zones. The detection results are sent to the control unit 17. The control unit 17 can create a map of the Z-directional positions of the zones. Based on such a map, the control unit can control the distance over which the susceptor 6 is raised, whenever the electrical characteristic of all chips formed on a wafer W is measured.

A description will now be given of the operation of the probe apparatus of the first embodiment.

(a) In FIG. 1, a wafer W taken out of a cassette C is placed on the substrate-fixing mechanism 23 on the susceptor 6.

(b) After the substrate-fixing mechanism 23 fixes the wafer W by, for example, a vacuum suction force, the lower camera 15b photographs the X-, Y- and θ-directional positions of the probe card 14. The X-, Y- and θ-directional position information concerning the probes 26 acquired based on the photograph is stored in the control unit 17.

(c)

(c1) Subsequently, the first optical length-measuring unit 4 (4a, 4b) measures the distance between the reference plane (Au plate) 13 attached to the susceptor 6, and the probes 26. Specifically, the first irradiator 4a of the first optical length-measuring unit 4 emits a laser beam to the Au plate 13. The laser beam reflected from the Au plate 13 enters the first detector 4b. Data indicating the Z-directional position of the Au plate 13 detected from the entering beam is stored in the control unit.

(c2) The susceptor 6 is raised to bring the Au plate 13 into contact with the probes 26. At this time, data indicating the distance, over which the susceptor 6 is raised, is stored in the control unit as data on the distance between the Au plate 13 and the probes 26. The length of the probes 26 is not always constant between different probe cards 14. By this process, the actual distance between the Au plate 13 and the probes 26 can be detected. The fact that this process can determine the distance therebetween indicates that, in the first embodiment of the invention, the position of the chip 1 can be detected by only one optical length-measuring unit.

(d) The upper camera 15a photographs the wafer W, and data indicating the X-, Y- and θ-directional positions of a certain chip 1 to be detected is stored in the control unit 17.

(e) The first optical length-measuring unit 4 detects the Z-directional position of the surface of the chip 1. The irradiator 4a of the first optical length-measuring unit 4 emits a laser beam to the chip 1, and the laser beam reflected from the chip 1 enters the first detector 4b.

(f) The control unit 17 computes the distance between the chip 1 and the probes 26 using the detected position of the chip 1 and the stored position of the Au plate 13.

(g) Based on the position of the chip and those of the probe 26 stored in the control unit 17, the moving mechanism 16 moves the susceptor 6 to align the X-, Y- and θ-directional positions of the chip 1 with those of the probe card 14.

(h) Based on the distance between the chip 1 and the probes 26 detected in the above-described step (f), the moving mechanism 16 raises the susceptor 6 to bring the chip 1 into contact with the probes 26.

(i) The moving mechanism 16 further raises the susceptor 6 to overdrive it.

(j) In this state, the electrical characteristic of the chip 1 is measured.

(k) A movement corresponding to one chip is made, thereby repeating the operations (h) to (j) to measure the electrical characteristic of all chips 1 formed on the wafer W.

In the method for detecting the Z-directional position of the surface of the chip 1, the position of each chip 1 is detected using the first optical length-measuring unit 4 as in the step (e). However, the Z-directional positions of a plurality of surface portions of the wafer W may be detected using the first optical length-measuring unit 4 (e1), thereby creating a map in which the surface of the wafer W is divided into several zones 19 (e2). It is desirable that the to-be-detected portions be a plurality of discrete points on the wafer W. For example, the unevenness of the wafer W can be detected accurately by dividing the entire surface of the wafer W into small areas as shown in FIG. 5. In FIG. 5, the black point in each chip 1 indicates a candidate point to be detected by the first optical length-measuring unit. In this case, the detection results are stored in the control unit 17, and the control unit 17 can divide the wafer W into several zones 19, and create a Z-directional position map using each zone 19 as a plane. Based on this map, the control unit 17 compares, in the above-described step (f), the Z-directional position of each zone 19 with the stored position of the Au plate 13, thereby computing the distance between each zone 19 and the probes 26. Thus, a map, in which a plurality of surface portions of the wafer W are detected, is created, which requires less time and effort than in the case of detecting the position of each chip 1, and hence enhances the testing efficiency.

Figure 6:
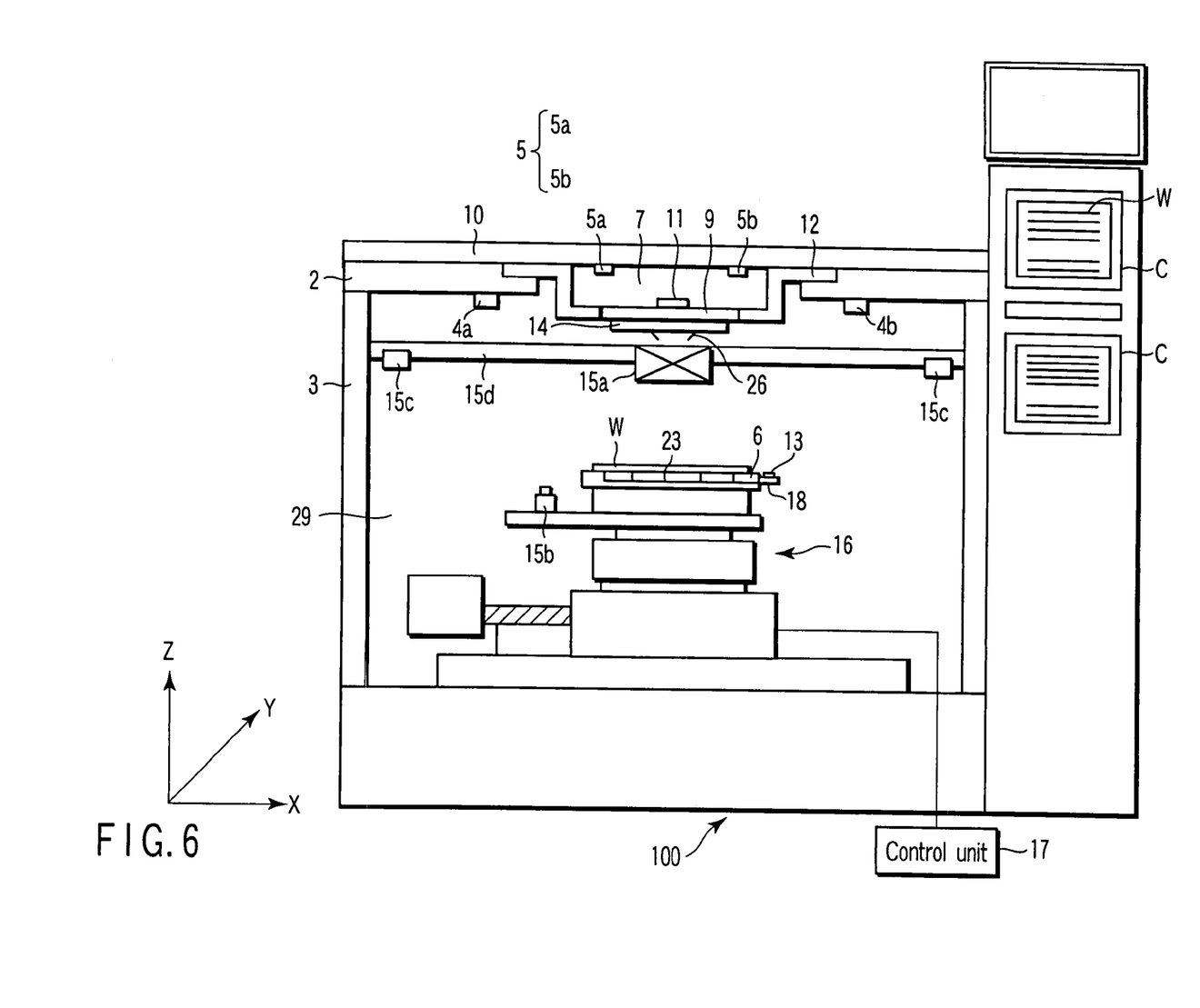
FIG. 6 is a sectional view of a probe apparatus according to a second embodiment.

FIG. 6 shows a second embodiment of the invention. The second embodiment comprises, as well as the elements of the probe apparatus of the firsts embodiment, a second optical length-measuring unit 5 for detecting a change in the Z-directional position of the probe card 14. Since the other elements of the second embodiment are similar to those of the first embodiment, only the second optical length-measuring unit 5 will be described. The second optical length-measuring unit 5 may be similar to the first optical length-measuring unit 4, and may incorporate a second irradiator 5a and second detector 5b.

As shown in FIG. 6, the probe apparatus of the second embodiment may comprise a holding plate 10 provided on the upper wall 2 and covering the opening 7. In the second embodiment, the second optical length-measuring unit 5 may be provided on the lower surface of the holding plate 10 within the space 7.

Figure 7:
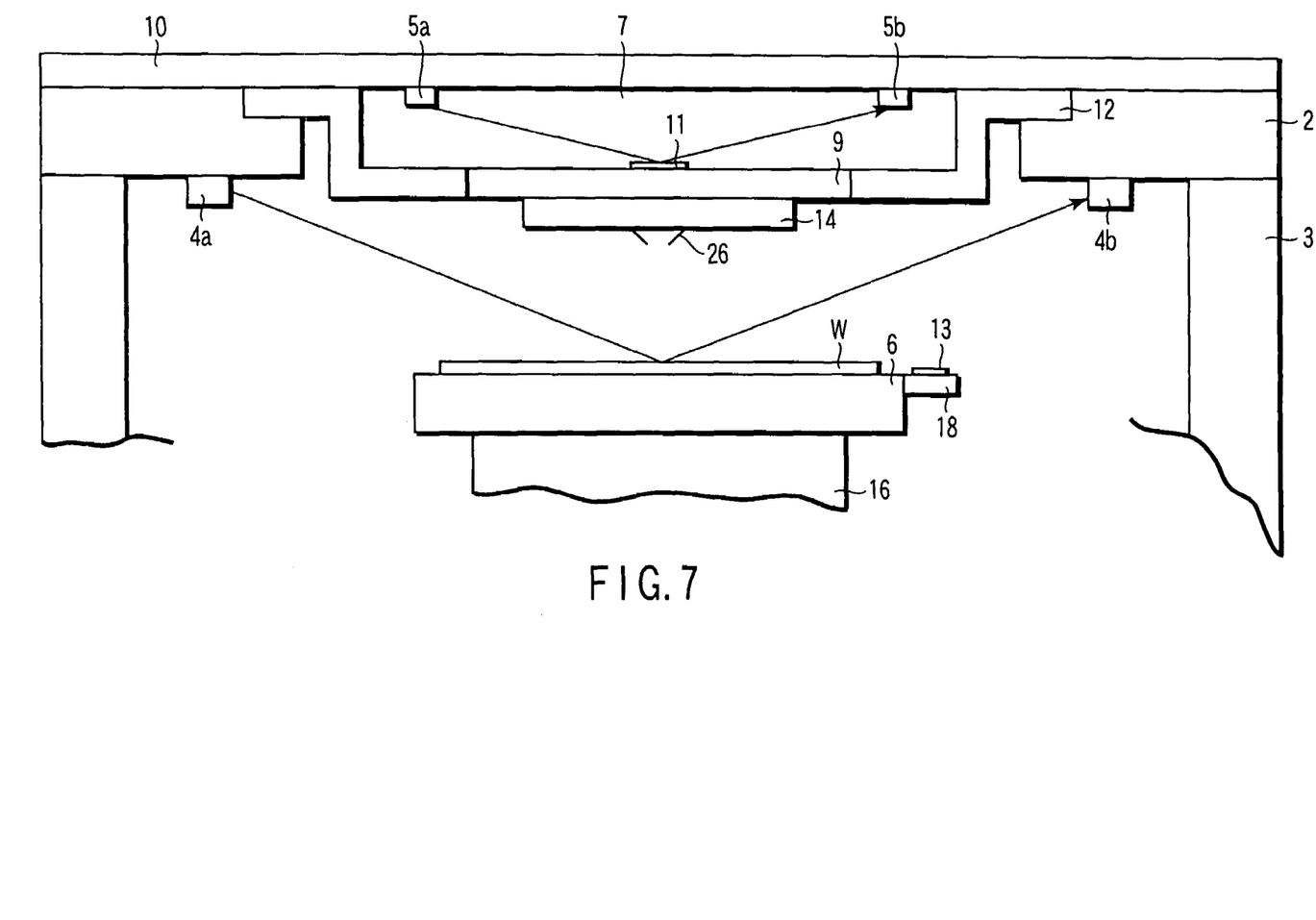
FIG. 7 is an enlarged view illustrating an essential part of the probe apparatus of the second embodiment.

FIG. 7 is an enlarged view illustrating an essential part of FIG. 6. The second embodiment may incorporate a probe-card support member 9 for supporting the probe card 14, like the first embodiment. The probe card 14 may be attached to the lower surface of the probe-card support member 9. The second optical length-measuring unit 5 detects the upper surface of the probe-card support member 9 to detect a change in the Z-directional position of the probe card 14. The probe-card support member 9 may incorporate a reflector 11 for reflecting the emitted light, at a position that can be detected by the second optical length-measuring unit 5. The reflector 11 may be any type of reflector if it has a light-reflective flat surface. In the second embodiment, a mirror is employed as the reflector.

Probe tests may be performed at high temperature. In such a case, the temperature of the probe card 14 becomes high, therefore the probe card may well be deformed. Further, the probe card 14 is pressed by the chip 1, i.e., the susceptor 6, via the probes 26. For these reasons, the probe card 14 may be deformed and vertically moved during a probe test. In this case, the probe-card support member 9 and/or the head plate 12, to which the probe card 14 is attached, is deformed together. When the probe card 14 is deformed, the positions of the probes 26 are changed, thereby changing the contact positions between the probes 26 and the chip 1. Accordingly, it is possible that the chip 1 and probes 26 will contact each other with a higher pressure than necessary, whereby the chip 1 may be damaged. In contrast, they may contact with a lower pressure, which leads to a reduction in testing accuracy.

In light of the above, in the second embodiment, the second optical length-measuring unit 5 detects a change in the Z-directional position of the probe card 14. Data indicating the detected change of the probe card 14 is stored in the control unit 17. Based on the data, the control unit 17 can adjust the distance over which the susceptor 6 is raised. As a result, even if the probe card 14 is deformed during a test, the chip 1 can be brought into an appropriate contact with the probes 26. This being so, the positions of all chips 1 on the wafer W can be detected accurately and reliably.

Figure 8:
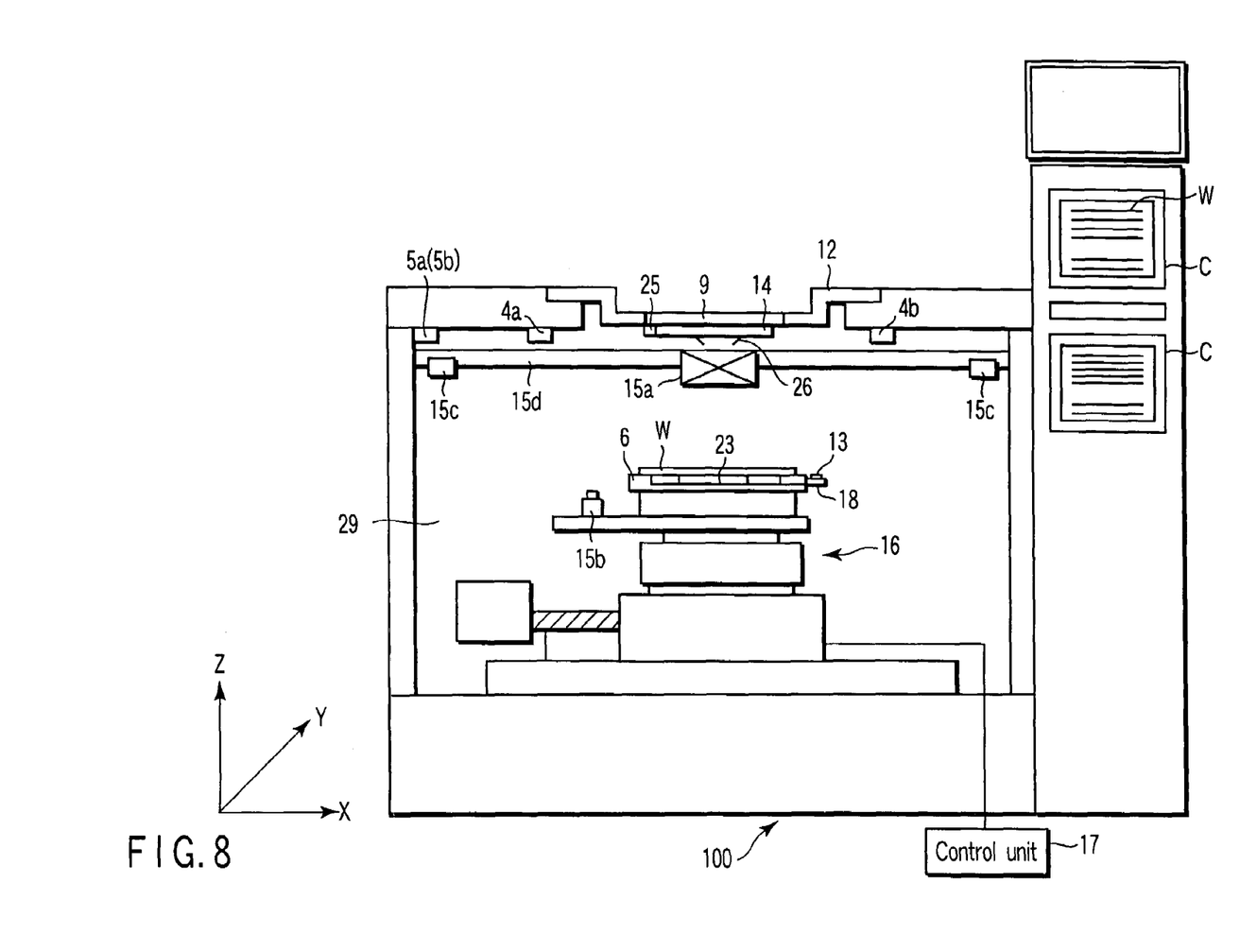
FIG. 8 is a sectional view of a probe apparatus according to a third embodiment.
Figure 9:
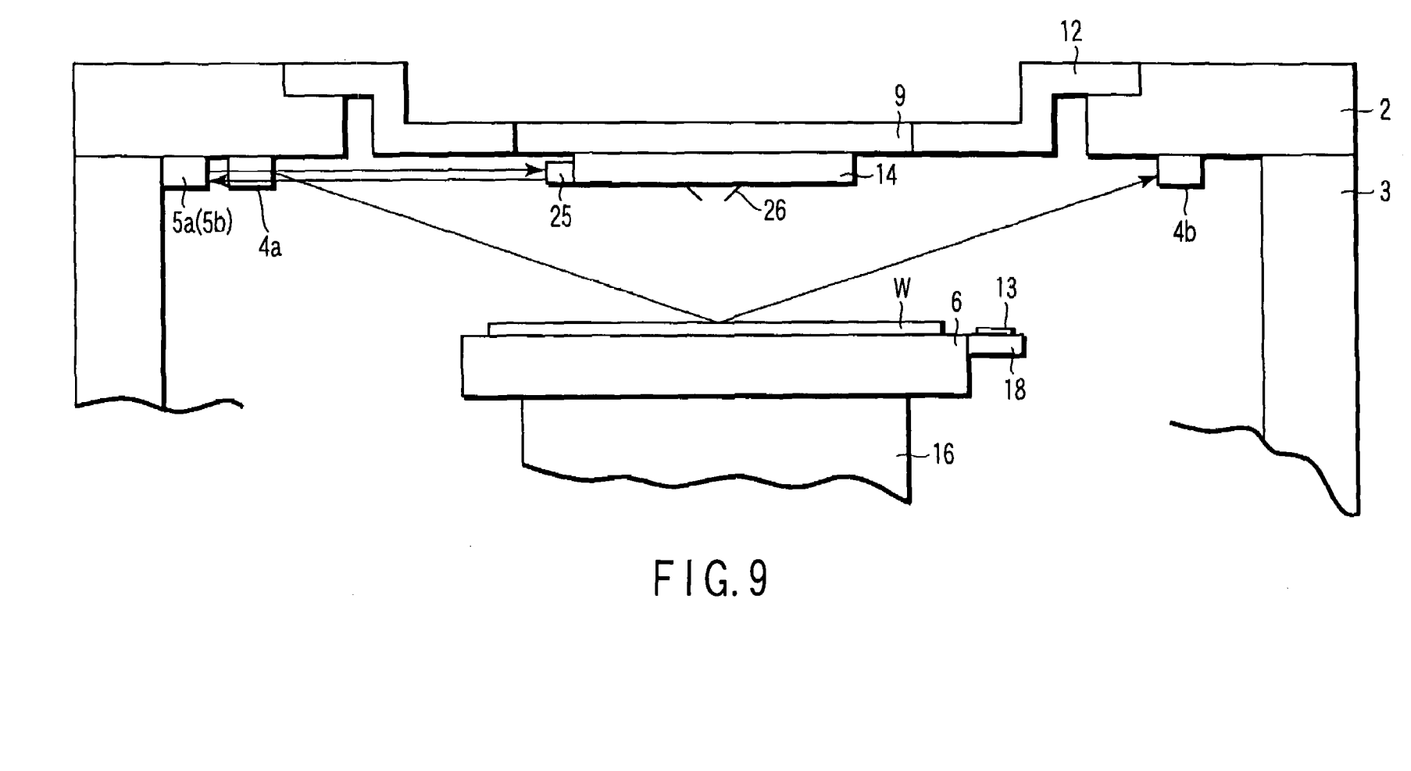
FIG. 9 is an enlarged view illustrating an essential part of the probe apparatus of the third embodiment.

FIG. 8 shows a third embodiment of the invention. The third embodiment is directed to a probe apparatus that comprises a second optical length-measuring unit 5 (5a, 5b), as well as the elements of the first embodiment. The second optical length-measuring unit 5 can have the same structure and function as that of the second embodiment. In the third embodiment, the second optical length-measuring unit 5 is located in the prober chamber 29. As shown in FIG. 9, the second optical length-measuring unit 5 of the third embodiment can detect a side of the probe card 14 to detect a change in the Z-directional position of the probe card 14. The second optical length-measuring unit 5 comprises a second irradiator 5a and second detector 5b located on the upper wall 2 or a sidewall 3 of the prober chamber 29. The second irradiator 5a and second detector 5b may be located adjacent to each other, or may be formed as one unit as shown in FIG. 9. This structure can simplify the structure of the second optical length-measuring unit 5, which facilitates the adjustment of the apparatus.

An optical element 25 may be provided on a side of the probe card 14 to be detected by the second optical length-measuring unit 5. Light emitted from the second irradiator 5a reflects from the optical element 25 and enters the detector 5b. The optical element may be formed of, for example, a prism 25. It may also be formed of a corner cube prism or retroreflector. It may further be formed of a plurality of mirrors.

The second optical length-measuring unit 5 may be located outside the prober chamber. In this case, a hole for passing light therethrough is formed in a sidewall of the chamber to permit light to be detected from the outside of the prober chamber. When the optical length-measuring unit 5 is located outside the prober chamber, it can be attached or handled easily.

The probe apparatuses of the second and third embodiments operate in the same manner as that of the first embodiment. In the former apparatuses, however, the operation of the second optical length-measuring unit 5 is added. In the above-described step (b), after the control unit 17 stores data indicating the positions of the probes 26, the second optical length-measuring unit 5 can detect the Z-directional position of the probe card (b2). The second optical length-measuring unit 5 can always or when necessary detect a change in the position of the probe card 14. The detection result of the second optical length-measuring unit 5 is sent to the control unit 17 and used to determine the distance between the chip 1 and the probes 26 in the above-described step (f). Based on the detected distance, the control unit 17 can raise the susceptor 6 to bring the chip 1 into contact with the probes 26 with a predetermined pressure.

The embodiments of the invention can provide a probe apparatus capable of accurately aligning the Z-directional position of each chip with those of probes, using a first optical length-measuring unit, and a probe testing method for enabling such accurate alignment.

The embodiments of the invention can provide a probe apparatus capable of accurately detecting the distance between a chip and probes, using a reference plane, thereby enabling accurate testing, and a probe testing method for enabling such accurate detection.

The embodiments of the invention can provide a probe apparatus capable of performing easy and accurate position detection, using a laser beam for an optical length-measuring unit, and a probe testing method for enabling such accurate position detection.

The embodiments of the invention can provide a probe apparatus capable of detecting only each electrode of a chip, using a laser beam with a diameter of 10 to 30 μm emitted from a first optical length-measuring unit, thereby realizing accurate and reliable position detection free from the influence of a pattern of a wafer W near each electrode.

The embodiments of the invention can provide a probe apparatus capable of detecting, using a first optical length-measuring unit, the Z-directional positions of a plurality of surface portions of a susceptor or a wafer W placed thereon, and creating a map based on the detection results, using a control unit, thereby omitting the time and effort required to detect the position of each chip, and enhancing the testing efficiency.

The embodiments of the invention can provide a probe apparatus capable of compensating for, when a probe card 14 is deformed during a test, deformation of the probe card, using a second optical length-measuring unit for detecting a change in the Z-directional position of the probe card, thereby always realizing accurate Z-directional positioning.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probe apparatus for testing an electrical characteristic of a to-be-tested object formed on a substrate W, comprising:
   a prober chamber;
   a susceptor provided in the prober chamber and configured to place thereon a substrate with a plurality of to-be-tested objects formed;
   a probe card provided in the prober chamber, the probe card including a plurality of probes and opposing the susceptor; and
   a first optical length-measuring unit configured to emit light to a surface of at least one to-be-tested object placed on the susceptor, detect a position, on a light-receiving surface of the first optical length-measuring unit, of light reflected from said at least one to-be-tested object, and detect a Z-directional position of said at least one to-be-tested object based on the detected position of light reflected.

2. The probe apparatus according to claim 1, further comprising a reference plane attached to the susceptor, the reference plane being referred to when the first optical length-measuring unit detects the Z-directional position.

3. The probe apparatus according to claim 1, wherein the light emitted from the first optical length-measuring unit is a laser beam.

4. The probe apparatus according to claim 3, wherein the laser beam has a diameter of 10 to 30 μm.

5. The probe apparatus according to claim 1, wherein the first optical length-measuring unit is attached to one of an upper wall and a sidewall of the prober chamber.

6. The probe apparatus according to claim 1, further comprising a moving mechanism configured to move the susceptor in a Z-direction, and a control unit configured to control the moving mechanism,
   and wherein:
   the first optical length-measuring unit detects Z-directional positions of a plurality of surface portions of one of the susceptor and the substrate placed on the susceptor; and
   the control unit creates a map concerning the Z-directional positions of the plurality of surface portions, based on the Z-directional positions of the plurality of surface portions detected by the first optical length-measuring unit.

7. The probe apparatus according to claim 1, further comprising a second optical length-measuring unit configured to emit light to a surface of a support member supporting the probe card, detect a position, on a light-receiving surface of the second optical length-measuring unit, of light reflected from the support member, and detect a Z-directional position of the probe card based on the detected position of light reflected.

8. The probe apparatus according to claim 7, wherein the light emitted from the second optical length-measuring unit is a laser beam.

9. The probe apparatus according to claim 7, further comprising a holding plate located above the probe card, and wherein the second optical length-measuring unit is attached to a surface of the holding plate opposing the probe card.

10. The probe apparatus according to claim 9, further comprising a probe-card support member supporting the probe card, the probe-card support member being attached to an upper surface of the probe card, and wherein the second optical length-measuring unit detects an upper surface of the probe-card support member to detect a change in the Z-directional position of the probe card.

11. The probe apparatus according to claim 10, wherein the probe-card support member includes a reflector provided on a portion thereof to be detected by the second optical length-measuring unit, the reflector reflecting the emitted light.

12. The probe apparatus according to claim 7, wherein the second optical length-measuring unit detects a side surface of the probe card to detect a change in the Z-directional position of the probe card.

13. The probe apparatus according to claim 12, wherein the probe card includes an optical element provided on a side surface thereof to be detected by the second optical length-measuring unit, the optical element reflecting the emitted light.

14. A method of testing a to-be-tested object using the probe apparatus as claimed in claim 1, comprising:
   (a) placing the substrate on the susceptor;
   (b) (b1) detecting a Z-directional position of a reference plane attached to the susceptor, using the first optical length-measuring unit;
   (b2) raising the susceptor and bringing the reference plane into contact with the probes to determine a distance between the reference plane and the probes;
   (c) detecting a Z-directional position of the to-be-tested object, using the first optical length-measuring unit;
   (d) measuring a distance between a surface of the to-be-tested object and tips of the probes based on results of said (b) and (c);
   (e) raising the susceptor in a Z-direction to bring the to-be-tested object into contact with the probes, using a moving mechanism based on the distance between the to-be-tested object and the probes detected in said (d); and
   (f) measuring an electrical characteristic of the to-be-tested object.

15. The method according to claim 14, wherein:
   said (c) includes:
   (c1) detecting Z-directional positions of a plurality of surface portions of the substrate, using the first optical length-measuring unit; and
   (c2) creating a map concerning the detected Z-directional positions of the plurality of surface portions of the substrate, and
   said (d) includes moving the susceptor in the Z-direction to bring the to-be-tested object into contact with the probes, using the moving mechanism based on the map created in said (b) and (c2).

16. The method according to claim 14, further comprising,
   (a2) after said (a), a second optical length-measuring unit emitting light to an upper surface of a support member supporting the probe card, detecting a position, on a light-receiving surface of the second optical length-measuring unit, of light reflected from the support member, and detecting a Z-directional position of the probe card based on the detected position,
   and wherein said (d) includes detecting a distance between the to-be-tested object and the probes, based on the detection result acquired in said (a2) in addition to the detection results acquired in said (b) and (c).

17. The method according to claim 14, further comprising:
   (g) after said (f), moving the substrate by a measuring pitch corresponding to one to-be-tested object, repeating said (e) to (f) to measure next to-be-tested objects.

* * * * *